(12) United States Patent
Johansson et al.

(10) Patent No.: US 7,025,615 B2
(45) Date of Patent: Apr. 11, 2006

(54) FABRICATION METHOD, VARACTOR, AND INTEGRATED CIRCUIT

(75) Inventors: Ted Johansson, Djursholm (SE); Hans Norström, Solna (SE); Stefan Sahl, Solna (SE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/873,781

(22) Filed: Jun. 22, 2004

(65) Prior Publication Data

US 2004/0235257 A1    Nov. 25, 2004

Related U.S. Application Data

(63) Continuation of application No. PCT/SE03/00048, filed on Jan. 15, 2003.

(30) Foreign Application Priority Data

Jan. 18, 2002    (SE) .................................... 0200137

(51) Int. Cl.
*H01L 21/20* (2006.01)
(52) U.S. Cl. ..................... 439/309; 438/329; 438/379
(58) Field of Classification Search ......... 438/309–379
See application file for complete search history.

(56) References Cited

U.S. PATENT DOCUMENTS

| | | | | |
|---|---|---|---|---|
| 4,106,953 A | | 8/1978 | Onodera ..................... 148/1.5 |
| 5,024,955 A | * | 6/1991 | Kasahara .................... 438/379 |
| 5,405,790 A | | 4/1995 | Rahim et al. ................. 437/34 |
| 5,477,197 A | | 12/1995 | Logan ......................... 331/158 |
| 5,506,442 A | * | 4/1996 | Takemura .................... 257/597 |
| 6,559,024 B1 | * | 5/2003 | Boles et al. ................. 438/379 |

FOREIGN PATENT DOCUMENTS

| | | |
|---|---|---|
| EP | 1 139 434 A2 | 3/2001 |
| WO | WO 01/20664 A1 | 3/2001 |
| WO | WO 01/95396 A2 | 12/2001 |

OTHER PUBLICATIONS

Norwood, Marcus H. et al.; "Voltage Variable Capacitor Tuning: A Review"; Proceedings of the IEEE, vol. 56, No. 5; pp. 788-797, 1968.

\* cited by examiner

*Primary Examiner*—H. Jey Tsai
(74) *Attorney, Agent, or Firm*—Baker Botts L.L.P.

(57) ABSTRACT

A method in the fabrication of an integrated bipolar circuit for forming a p/n-junction varactor is disclosed. The method featuring the steps of providing a p-doped substrate (10; 10, 41); forming a buried $n^+$-doped region (31) in the substrate; forming in the substrate an n-doped region (41) above the buried $n^+$-doped region (31); forming field isolation (81) around the n-doped region (41); multiple ion implanting the n-doped region (41); forming a $p^+$-doped region (151) on the n-doped region (41); forming an $n^+$-doped contact region to the buried $n^+$-doped region (31), the contact region being separated from the n-doped region (41); and heat treating the hereby obtained structure to set the doping profiles of the doped regions. The multiple ion implantation of the n-doped region (41); the formation of the $p^+$-doped region (151); and the heat treatment are performed to obtain a hyper-abrupt $p^+$/n-junction within the n-doped region (41).

21 Claims, 5 Drawing Sheets

FABRICATION METHOD, VARACTOR, AND INTEGRATED CIRCUIT

CROSS REFERENCE TO RELATED APPLICATION

This application is a continuation of copending International Application No. PCT/SE03/00048 filed Jan. 15, 2003 which designates the United States, and claims priority to Swedish application no. 0200137-8 filed Jan. 18, 2002.

TECHNICAL FIELD OF THE INVENTION

The present invention generally relates to the field of silicon IC-technology, and more specifically the invention relates to the formation of a varactor in a semiconductor bipolar or BiCMOS process flow; to the varactor formed, and to a voltage controlled oscillator (VCO).

DESCRIPTION OF RELATED ART AND BACKGROUND OF THE INVENTION

Advanced silicon bipolar, CMOS or BiCMOS circuits are used today for high-speed applications in the 1–5 GHz frequency range, replacing circuits previously only possible to realize using III–V based technologies.

A common trend in microelectronics is to integrate more and more functions on a single chip, in order to increase the general performance of the circuits and to reduce size, power consumption and price of the system.

High-performance bipolar integrated circuits have been used extensively for critical building blocks in telecommunication circuits, mainly for the analog functions, e.g. for switching currents and voltages, and for the high-frequency radio circuit functions (mixers, amplifiers, detector etc.). The versatility of a BiCMOS-process is many times preferred, although it is not suited for all applications. For high-performance cost-effective circuits, such as would be used in a cellular telephone, a bipolar-only process is many times still to prefer.

Voltage-controlled oscillators (VCO), typically used in phase-locked loops (PLL), are important building blocks in many high-frequency telecommunication applications. VCO: s are often realized as LC-sinusoidal oscillators due to a higher quality factor of the tank circuit, and therefore better phase noise performance. The resonant frequency $f_r$ for a LC-resonant circuit is given by:

$$f_r = \frac{1}{2\pi\sqrt{LC}} \quad (1)$$

By using a varactor, the resonant frequency can be varied by adjusting the voltage V over the capacitor.

A varactor can be realized by using the depletion capacitance characteristics of a p/n-junction, which is available in any semiconductor process. Alternatively, a varactor may be realized using an MOS-transistor, which is only available in CMOS or BiCMOS processes.

Due to the relationship between voltage and capacitance of the particular varactor, the voltage-frequency relationship of the VCO will have different non-linear characteristics. If the varactor characteristics could be tuned so that this relationship would become linear, it would be advantageous for circuit design.

One advantage is when the VCO is used in a PLL with changeable dividing ratio. If a linear relationship exists between the tuning voltage and the resonant frequency, the loop gain and therefore the characteristics of the PLL will be less dependent of the dividing ratio.

A second advantage is when noise is added to the tuning voltage, this noise will be converted to phase noise of the VCO due to the voltage-to-frequency nature of the varactor. If for a given tuning range, linear characteristics can be obtained, the phase noise will be constant over the whole tuning range. This also means than noise minimization over the interval will be easier to do when the noise is constant.

The diode varactor is easiest to use for such tuning by varying the doping profile, while the MOS varactor characteristics cannot be manipulated extensively.

Two types of capacitance are associated with a junction: depletion capacitance and diffusion capacitance. A diode-based varactor is operated in the reverse-bias mode, and in this mode the depletion capacitance is dominant. As the magnitude of the reverse bias applied to the junction increases, the field in the depletion region becomes larger and the majority carriers are pulled back further from the junction. The junction will act similar to a parallel-plate capacitor, but with variable "plate distance". The relationship between the stored charge in the depletion region (the capacitance) and the applied voltage will not in general be linear, but vary depending on the doping profile in the depletion region.

The nonlinear depletion capacitance can be expressed by the following equation:

$$C_j = \left|\frac{dQ}{dV_D}\right| \quad (2)$$

in which dQ is the differential of the charge stored in one side of the depletion region. $dV_D$ is the differential voltage and $C_j$ is the capacitance of the diode. The junction capacitance can also computed via the one-dimensional capacitor formula:

$$Cj = \frac{\varepsilon}{W} \quad (3)$$

where W is the width of the depletion region. The expression for a one-sided abrupt junction, which is very common in integrated circuits, is given by:

$$W = \left[\frac{2\varepsilon(V - V_{bi})}{q}\left(\frac{N_a + N_d}{N_a N_d}\right)\right]^{1/2} \quad (4)$$

where V is the applied reverse voltage applied to the p/n-junction, $V_{bi}$ the built-in voltage of the junction, and $N_a$ and $N_d$ are the acceptor and donator doping concentrations of the depletion region.

To estimate the incremental capacitance of a varactor diode, the following equation can be used, where the capacitance-voltage relationship is approximated:

$$C_j = \frac{C_{jo}}{\left[1 - \left(\frac{V_D}{V_{bi}}\right)\right]^n} \qquad (5)$$

where $C_{jo}$ is the incremental depletion capacitance for zero bias, n is the grading coefficient, $V_D$ is the operating-point voltage and $V_{bi}$ is the built-in barrier potential. Formula (5) is extensively used in circuit simulations for basic junction capacitance modeling.

The grading coefficient refers to the way in which the doping levels change with distance across the junction. If the junction is abrupt, n=½, the doping levels change abruptly at the junction but are constant throughout each side. For a linearly graded junction, n=⅓, the doping levels change linearly with distance.

An important characteristic of a varactor is its capacitance-tuning ratio, defined as the capacitance at low voltage bias (e.g. close to 0 V) divided by the capacitance at higher voltage bias (e.g. close to $V_{cc}$). Typical realistic values of tuning range, using $V_{low}$=0.5 V and $V_{high}$=2.5 V, is 1.5–2.0.

The zero bias depletion capacitance $C_{jo}$ is approximately proportional to the area of the junction and the doping level (highly doped junction give high capacitance).

Although any diode can act as a varactor, it is often necessary to design a special varactor to fulfill the requirements of a fully integrated VCO.

A review of details regarding varactors is given by M. H. Norwood and E. Shatz in "Voltage Variable Capacitor Tuning: A Review", Proc. IEEE, Vol. 56, No. 5, p. 788, 1968.

In U.S. Pat. No. 5,405,790 is described how to integrate a varactor in a BiCMOS process. An N well of a varactor region is formed in an epitaxial layer by doping the epitaxial layer with an N type dopant. A cathode region is formed in the N well by further doping the N well with the N type dopant. Cathode electrodes are formed by patterning a layer of polysilicon over the epitaxial layer. Subsequently, the cathode electrodes are doped with an N type dopant. A region adjacent the cathode region is doped to form a lightly doped region. The lightly doped region is doped with a P type dopant to form an anode region.

In U.S. Pat. No. 5,477,197 is described how an undesirable relationship between user applied input frequency control voltage and output frequency of a voltage controlled oscillator is counteracted by controlling the characteristics of an amplifier stage in the oscillator as a function of frequency control signal in addition to controlling the output frequency of the oscillator as a function of the capacitance of a user controlled variable capacitance in response to the frequency control signal.

SUMMARY OF THE INVENTION

U.S. Pat. No. 5,405,790 does not teach how to select or control the doping profile/CV-characteristics of the varactor, and the circuit of U.S. Pat. No. 5,477,197 is not fully integratable as, inter alia, a crystal oscillating element is used.

For a VCO using a general varactor design, the relationship between the applied voltage and the resonant frequency obtain is non-linear. If the varactor could be designed to obtain a linear relationship between voltage and frequency, this would be an advantage for circuit design.

Another shortcoming of a simple p/n-junction varactor is the small sensitivity, i.e. the capacitance variation with biasing voltage.

Accordingly, it is an object of the present invention to provide a method in the fabrication of a bipolar integrated circuit, particularly a bipolar integrated circuit for radio frequency applications, for forming a p+/n-junction varactor, which has a CV-characteristic suitable for being used in a VCO with a linear frequency response.

In this respect there is a particular object of the invention to provide such a method, which includes a number of multi-purpose processing steps, and thus wherein a minimum of specific processing steps for the varactor are added to a bipolar process.

It is a further object of the invention to provide such a method, which produces a varactor having good performance, preferably a high Q value.

It is yet a further object of the invention to provide such a method, which produces a varactor having high sensitivity.

To this end the present invention comprises according to a first aspect a method in the fabrication of a bipolar integrated circuit, particularly an integrated bipolar circuit for radio frequency applications, for forming a p+/n-junction varactor, which includes the steps of:

(i) providing a p-doped substrate; (ii) forming a buried n+-doped region for the varactor in the substrate; (iii) forming in the substrate an essentially n-doped region above the buried n+-doped region for the varactor; (iv) forming field isolation around, in a horizontal plane, the n-doped region; (v) doping the essentially n-doped region by a multiple ion implant; (vi) forming a p+-doped region on the essentially n-doped region; (vii) forming an n+-doped contact region to the buried n+-doped region; the contact region being separated from, in a horizontal plane, the n-doped region by the field isolation; and (viii) heat treating the hereby obtained structure to set the final doping profiles of the doped regions.

According to the present invention the steps of doping the essentially n-doped region by a multiple ion implant; forming a p+-doped region on the essentially n-doped region; and heat-treating the hereby-obtained structure are performed to obtain a hyper-abrupt p+/n-junction within the essentially n-doped region.

Further, the present invention includes according to second and third aspects a p+/n-junction varactor and an integrated circuit, preferably a VCO, including a p+/n-junction varactor, fabricated in accordance with the first aspect of the invention.

Further characteristics of the invention and advantages thereof will be evident from the detailed description of preferred embodiments of the present invention given hereinafter and the accompanying FIGS. 1–9, which are given by way of illustration only, and thus are not limitative of the present invention.

DETAILED DESCRIPTION OF EMBODIMENTS

A method of manufacturing a varactor of the present invention in a bipolar process, to which only a few specific process steps are added, is overviewed below with reference to FIGS. 1–6.

Figure 1:
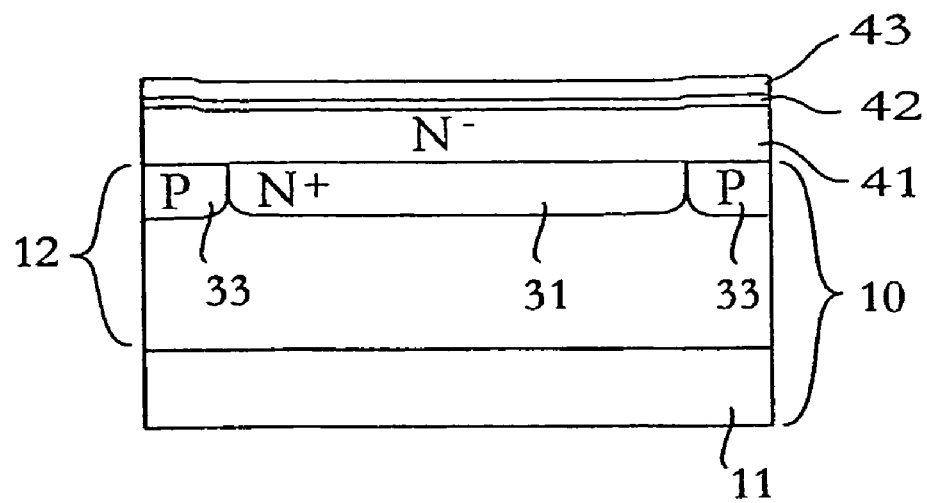
FIGS. 1–6 are highly enlarged cross-sectional views of a portion of a semiconductor structure during processing according to a preferred embodiment of the present invention.

To reach a structure as the one illustrated in FIG. 1 a starting material 10 consisting of a highly p+-doped wafer 11 is provided, on which a low-doped epitaxial silicon layer 12 of p-type is grown. Alternatively, the p-type wafer can be a homogeneously low-doped p-type wafer (not illustrated).

In the surface of the layer 12 buried n+-doped 31 and p-doped 33 regions are formed by means of (i) forming a thin protective layer of silicon dioxide (not illustrated) on the layer 12; (ii) forming a mask thereon by photolithographic methods to define the region for the n+-doped regions 31 (of which only one is shown in FIG. 1); (iii) n+-type doping the regions 31 defined by the mask; (iv) removing the mask; (v) heat treating the structure obtained; (vi) p-type doping the structure to obtain the regions 33; and (vii) exposing the upper surfaces of regions 31 and 33. The regions 31 are also referred to as buried n+-doped subcollectors as these are used for that purpose in bipolar npn transistors.

An epitaxial silicon layer 41 is grown on the wafer surface, where after a bi-layer including a grown oxide 42 and a silicon nitride layer 43 is formed thereon. Subsequently, the epitaxial silicon layer 41 is doped in selected regions to obtain regions of n- and p-type (n-wells and p-wells). In FIG. 1 all regions 41 are n-type doped. Advantageously, the n-type doping is kept very low and is performed to obtain a light retrograde doping profile in the upper portions of the layer 41. The resultant structure is illustrated in FIG. 1.

Alternatively, instead of providing the wafer 11 and forming the epitaxial layers 12 and 41, a single homogenous wafer may be provided, in which the buried regions 31 and 33 are formed by means of masked ion implantation at high energy and in which n- and optionally p-type doped surface regions 41 are formed by means of masked ion implantation. The term "substrate" as used herein is intended to denote a wafer, on which optionally a number of epitaxial layers have been grown.

In order to isolate the various regions 41 shallow 81 and optionally deep 71, 72 trenches are formed to surround the respective regions 41.

The shallow trenches 81 are formed by the steps of (i) patterning and etching away the silicon nitride 43 and oxide 42 layers at areas where the trenches are to be formed; and (ii) etching silicon, to form the structure. The shallow trenches are reoxidized and filled with a deposited oxide 81 subsequently to deep trench filling, see below.

The shallow trenches can be formed such that they extend vertically from the upper silicon surface, i.e. the upper surface of silicon layer 41, and down to the buried n+-doped layer regions 31, and preferably further down into the buried n+-doped layer 31 (not illustrated in FIGS. 1–6). Further, the buried n+-doped layers 31 and the shallow trenches can be formed relative each other such that the buried n+-doped layers 31 extend into areas located underneath the shallow trenches.

The deep trenches 71, 72 are formed by the steps of (i) forming a hard mask for the deep trenches by depositing a silicon dioxide layer, and patterning and etching this silicon dioxide layer to define openings for the deep trenches; (ii) etching the deep trenches; (iii) removing the remaining portions of the oxide hard mask layer; (iv) growing a thin oxide on top of the structure; (v) filling the deep trenches with deposited oxide (the thin oxide and the deposited oxide being together denoted by 71) and polysilicon 72; (vi) optionally planarizing the polysilicon; and (vii) etching back to remove all polysilicon from the shallow trench areas.

Figure 2:
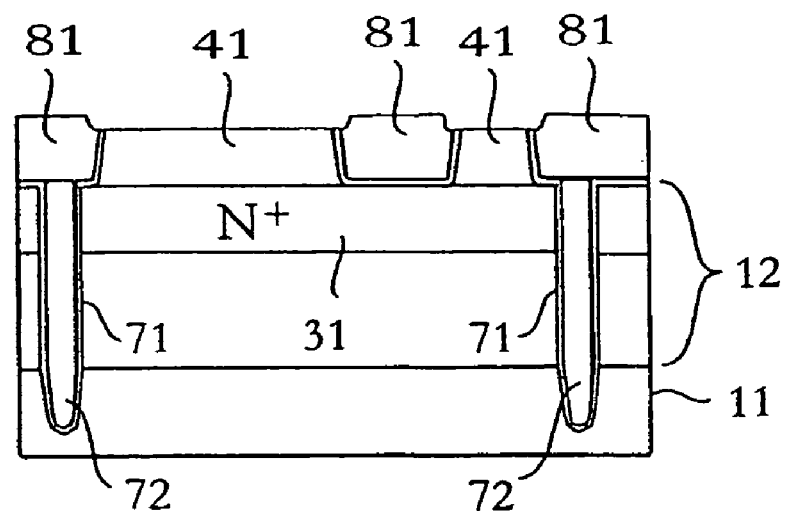

Subsequently thereto, the shallow trenches are filled with the oxide 81, whereupon the nitride and oxide layers, covering active areas 41, are removed. The resultant structure is illustrated in FIG. 2.

The isolation scheme is further described in the international publication WO 0120664 and in the Swedish patent application No. 0101567-6, both of which being hereby incorporated by reference.

Next, a thin oxide 111 is grown on exposed silicon surfaces.

Figure 3:
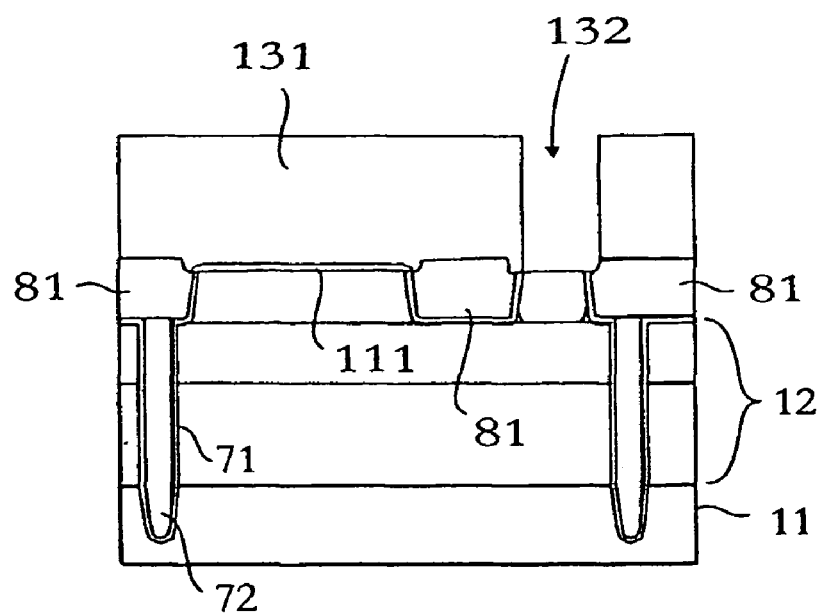

For the formation of the varactor a low-resistance path from the surface of the wafer to the buried n+-doped layer 31 is required. The path is defined lithographically by applying a mask 131 having an open area 132. Doping of n-type is performed through the open area 132. After the implantation, still having the photo mask 131 present on the wafer, the thin protective silicon dioxide layer 111 is removed in the open area 132. The resulting structure is shown in FIG. 3. The mask 131 is then removed by conventional methods, after which the wafer is optionally given a heat treatment.

Subsequently, a thin silicon nitride layer 141 is deposited, the purpose of which is twofold: (i) to add to the insulator layer deposited above the n-doped region 41 of the varactor; and (ii) to serve as an oxidation-resistant mask for the cathode contact 41 (to the right in FIG. 4), also referred to as a collector plug 41 since it is used for that purpose in a bipolar npn transistor.

Subsequent to the deposition of nitride layer 141, the wafer is lithographically patterned by depositing a photoresist layer 142 and then opening the resist for the varactor to be formed. The mask 142 has an opening 143 for the p/n-junction region of the varactor. The formation of the mask 142 being a first additional step for the varactor of the present invention if it is fabricated in a pure bipolar process or in a bipolar process with a few added processing steps to form PMOS components as described in our pending Swedish patent application No. 0103036-0 filed on May 4, 2001, the content of which being hereby incorporated by reference.

Below follow a short deduction of how the doping profile of the n-doped region 41 shall be selected in order to obtain a VCO with linear relationship between applied voltage and resonant frequency.

From equations (1) and (3) above we obtain $$f \propto \frac{1}{\sqrt{C}} \propto \sqrt{W} \qquad (6)$$

and therefore $$V \propto \sqrt{W}, \qquad (7)$$

i.e., the square root of the width of the depletion region of the varactor should be proportional to the applied voltage in order to achieve a linear relationship between voltage and frequency.

The desired doping profile, N(W), where W (>=0) is the distance from the p/n-junction down into the substrate, is obtained by deriving equation (7) two times, and solving the obtained Poisson equation $$\frac{\partial^2 V}{\partial W^2} \propto W^{-3/2} = \frac{-qN}{\varepsilon_s} \quad (8)$$

where N is a generalized doping distribution, $$N = BW^m \quad (9)$$

We identify m=−3/2 for our particular profile, which is a hyper-abrupt junction. This means that to achieve linear relationship between voltage and frequency, the doping profile should be selected as $N \propto W^{-3/2}$.

The profile cannot be realized by a diffused doping profile, which is set by the error function-complement function $$N \propto a \cdot \mathrm{erfc}\left(\frac{W}{b}\right) \quad (10)$$

or a single implanted profile, which is typically set by the Gaussian function $$N \propto c \cdot \exp\left(-\frac{W^2}{d}\right) \quad (11)$$

but it is possible to approximate a hyper-abrupt junction by using multiple ion implantations, or epitaxial processing.

By selecting implanting species with low thermal diffusion coefficient, such as arsenic (As) or antimony (Sb) (for p+/n-junctions), it will be assured that the resulting doping profile after completed processing will remain essentially as implanted.

Tuning of the profile by using epitaxial processing is not feasible in common bipolar RF-IC or BiCMOS process flows.

The structure includes typically about 170 Å silicon nitride 141 on top of about 100 Å thermal oxide 111 in the opening 143. The silicon has an phosphorus implanted n-well 41, which is lowly doped with a retrograde profile, on top of the buried n+-type doped region 31 (heavily n+doped).

Arsenic is preferably used for the varactor doping profile. It has a low thermal diffusion coefficient and is commonly available in industrial silicon processing environment.

For this structure, a multiple arsenic ion implant, with the photo resist 142 as a mask, is performed. A first implant using a dose of about 1.4E14 cm-2, and an energy of about 110 keV is performed, followed by a second implant using a dose of about 1E12 cm-2, and an energy of about 350 keV. These implantation steps being a second specific step for the varactor added to a bipolar fabrication process. Note that the opening 143 of the mask 142 is smaller than and located within the lateral extension of the n-well 41.

Figure 4:
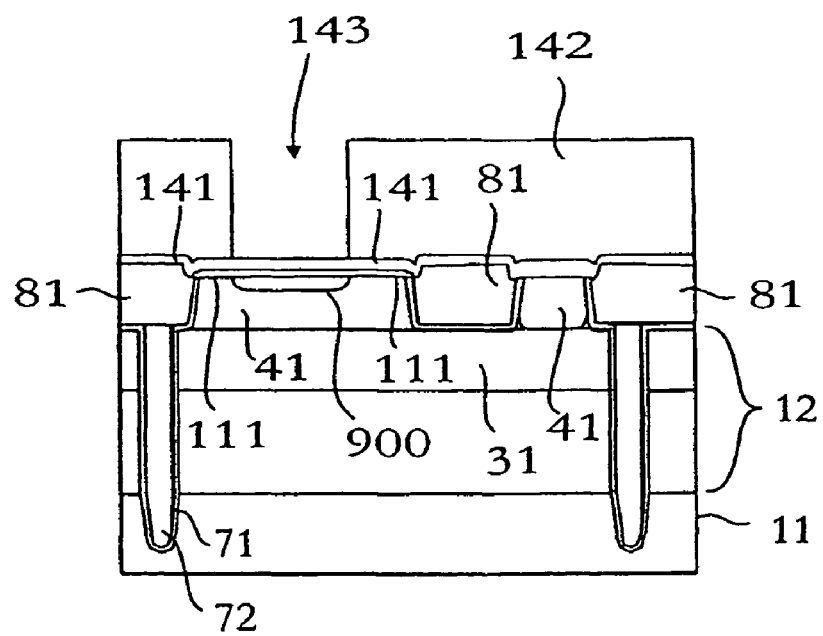

The resultant structure is illustrated in FIG. 4 wherein the multiple implanted region in the n-well 41 is denoted by 900. After the multiple implantations, the photo mask 142 is removed by conventional methods.

It shall however be appreciated that in an alternative version the opening 143 of the mask 142 may coincide with the lateral dimension of the n-well 41 such that the multiple implanted region 900 in the n-well 41 will reach the shallow trench isolation 81.

Portions of the nitride 141 and oxide 111 layers within the opening 143 are subsequently removed by conventional photolithographic methods: masking and etching. Preferably the opening made in the nitride 141 and oxide 111 layers is smaller than and located within the opening 143 and thus smaller than and located within the lateral extension of the n-well 41. By such procedure "wings" of nitride/oxide 141/111 will remain above the n-well 41 and thus set the lateral dimension of the p/n diode-based varactor.

It shall be appreciated that the application of mask 142 and the multiple ion implantations may be performed after the etching of the nitride 141 and oxide 111 layers instead of before. Arsenic will then be implanted directly into the silicon surface of the n-well 41 within opening 143. This procedure is less sensitive to process variations (variation in the oxide/nitride 141/111 bi-layer thickness) than implanting through the bi-layer structure 141/111. The implantation parameters (energy and dose) may have to be adjusted to compensate for the absence of the bi-layer structure 141/111.

A silicon layer 151 is next deposited on the structure. The deposition conditions are selected such that the layer 151 will be amorphous, but microcrystalline or polycrystalline silicon can alternatively be used. The purpose of the layer is to serve as the p+-type doped region of the p+/n-type diode varactor of the present invention.

After this deposition, the silicon layer is doped to p-type. The energy is preferably selected such that the implanted boron atoms will not reach through the deposited silicon layer 151. If a non-crystalline silicon layer is employed the control of the implanted doping profile is enhanced.

Figure 5:
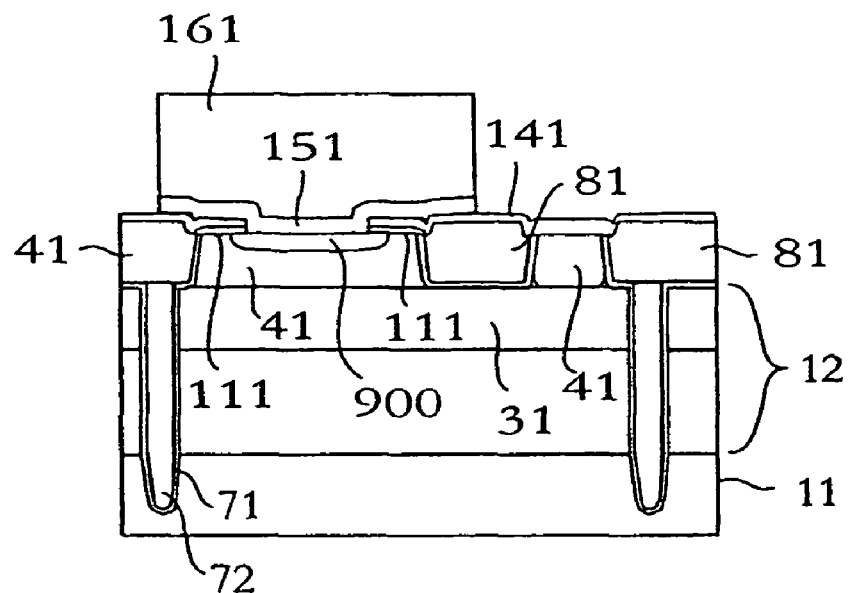

On top of the silicon layer 151, a low-temperature oxide layer (not illustrated) may be deposited, after which a photo mask 161 is applied to the structure. The resist protects the areas, which will form the p+-type doped region of the varactor. Using the mask 161, the low-temperature oxide layer and the silicon layer 151 are removed in open areas using dry etching. The etching is stopped when the silicon nitride layer 141 is completely exposed. The resulting structure is illustrated in FIG. 5.

Figure 6:
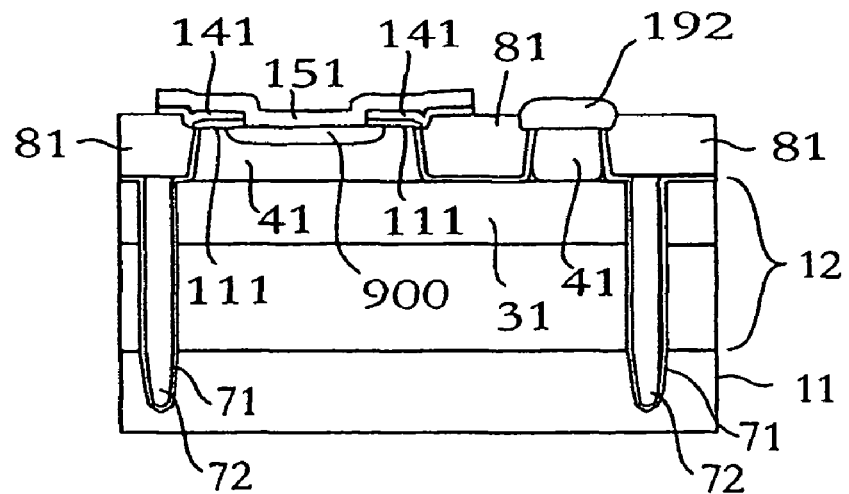

The thin nitride 141 present on shallow trench isolation 81 and on the contact region 41 (cathode contact) is removed, and a polycrystalline n-type doped contact area 192 to the buried n+-type doped layer 31 of the varactor is formed by means of (i) deposition of a polysilicon layer; (ii) n-type doping the polysilicon layer; and (iii) patterning and etching the polysilicon layer. The resulting structure is shown in FIG. 6.

Subsequently at least one dielectric layer (not illustrated) is deposited conformably on the structure, after which the wafer is exposed to high temperature to activate and drive-in the previously implanted dopants. In a preferred embodiment, the heat treatment is performed in a two-step procedure, wherein the wafer is first given a furnace anneal of 850° C. during about 30 minutes, which purpose is to redistribute the dopants more evenly in the implanted layers. Secondly, another heat treatment in nitrogen at about 1075° C. during 16 seconds using an RTA (Rapid Thermal Anneal) equipment is made. The purpose of this anneal is to electrically activate the implanted species, and to set the final doping profiles of the p/n-junction of the varactor.

The at least one dielectric layer is then removed, and the regions 151 and 192 may be provided with silicide in a self-aligned manner (SALICIDE) to reduce the resistance, after which the process continues with formation of passivation and metal layers.

Figure 7:
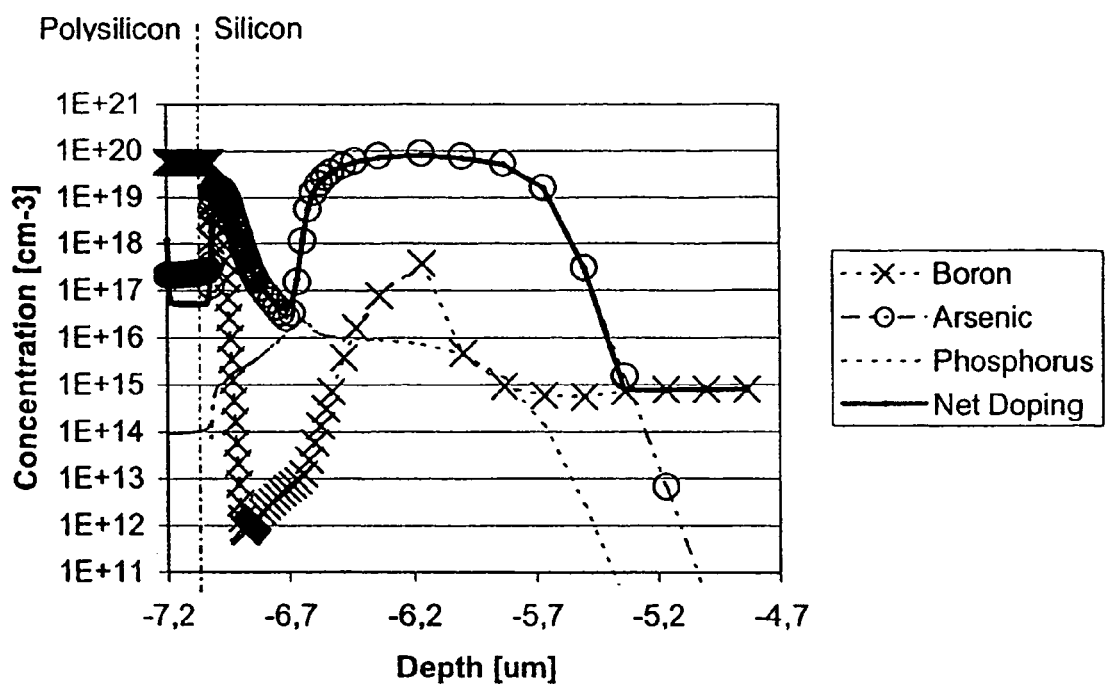
FIGS. 7 and 8 show in overview and in an enlarged detail view a simulated vertical 1D doping profile of the p+/n-junction varactor of the present invention.
Figure 8:
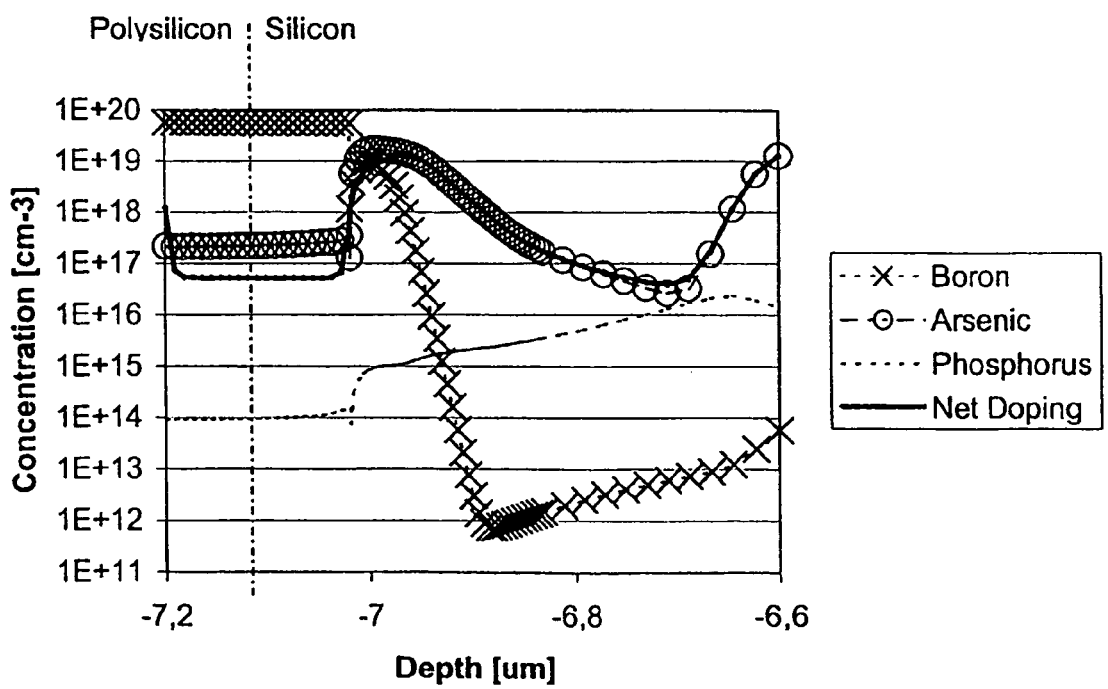

In FIGS. 7 and 8, the resulting simulated vertical 1D doping profile after complete processing is shown. The anode of the diode varactor consists of p+-type doping (boron) diffused from the top polysilicon contact 151. The cathode is the n-well 41, which was initially phosphorous-doped, and later n-doped in a multiple ion implantation step to set the varactor characteristics. Under the well, the n+-type doped buried layer 31 is situated, which is contacted to a deep n+-type doped plug (sinker) at the side of the structure, similar to a collector contact of an NPN transistor.

Figure 9:
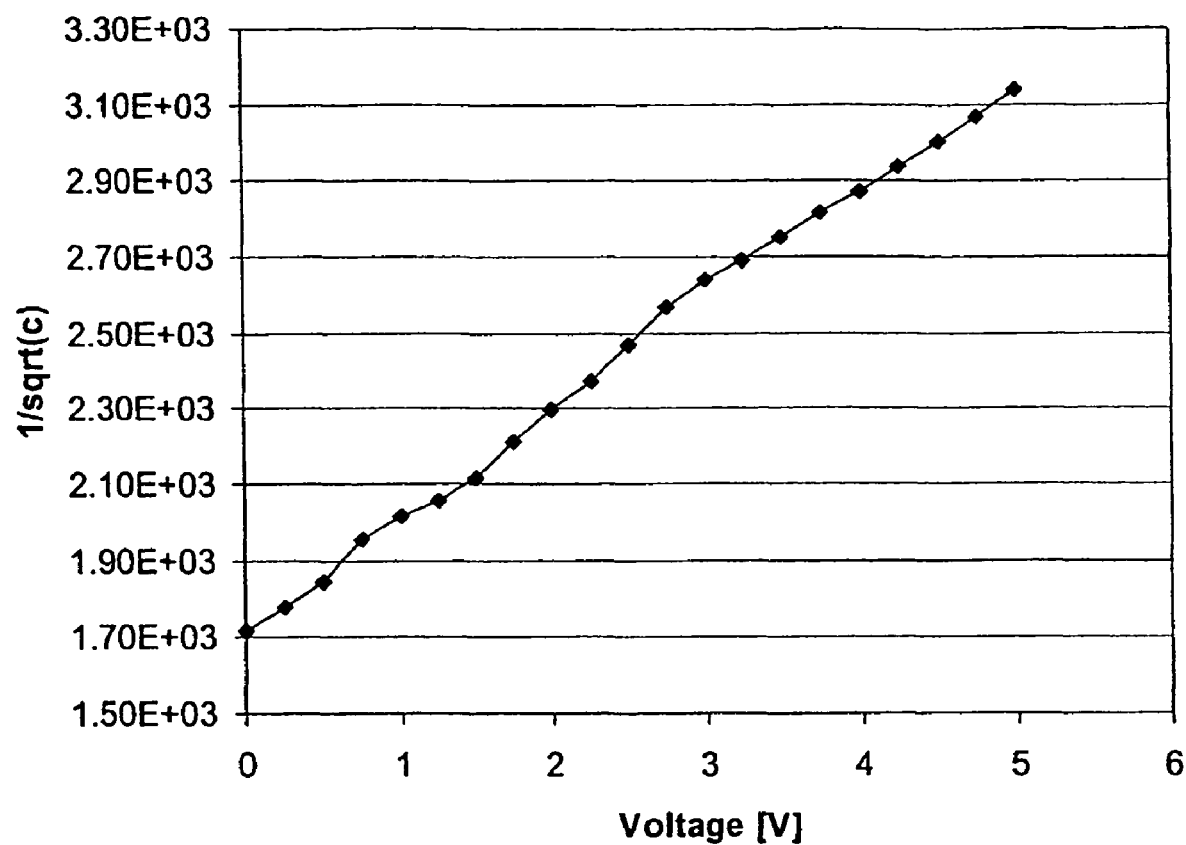
FIG. 9 illustrates C–V characteristics of the p+/n-junction varactor of the present invention, plotted as 1/sqrt(C) vs. V to show the linear dependence between voltage and frequency.

In FIG. 9 the resulting C–V characteristics is shown, plotted as the inverted square root of the capacitance versus voltage applied to show the linear dependence between the voltage and the frequency.

The tuning range, defined as the capacitance at 0.5 V divided by the capacitance at 2.5 V is 1.8, which is adequate. Using an optimized profile, the range can be increased, at least to 1.9, without sacrificing the linear behavior.

By means of the present invention, a varactor having an increased quality factor can be fabricated in a pure bipolar RF-IC process or in a BiCMOS process, to which only a few process steps are added.

The varactor according to the invention will produce a linear voltage-frequency relation when used in an LC-oscillator.

The varactor will have a high capacitance/area value at low bias because of the high doping concentration near the junction. In combination with the hyper-abrupt profile, this will increase the tuning range (sensitivity) of the device.

The varactor will also have a high Vbi as a result of the high doping levels involved, $V_{bi}$ being defined by:

$$V_{bi} \approx \frac{kT}{q} \ln \frac{N_A N_D}{n_i^2} \quad (12)$$

The high $V_{bi}$ gives additional margin in preventing the junction to be operated in forward direction at any time.

It will be obvious that the invention may be varied in a plurality of ways. Such variations are not to be regarded as a departure from the scope of the invention. All such modifications as would be obvious to one skilled in the art are intended to be included within the scope of the appended claims.

We claim:

1. A method in the fabrication of an integrated bipolar circuit for forming a pt+/n-junction varactor, comprising the steps of:
    providing a p-doped substrate;
    forming a buried n+-doped region for the varactor in said substrate;
    forming in said substrate an essentially n-doped region above the buried n+-doped region for the varactor;
    forming field isolation around, in a horizontal plane, said n-doped region;
    doping said essentially n-doped region by a multiple ion implant;
    forming a p+-doped region above said essentially n-doped region;
    forming an n+-doped contact region to the buried n+-doped region; said contact region being separated from, in a lateral plane, said n-doped region by said field isolation; and
    heat-treating the hereby-obtained structure to set the final doping profiles of the doped regions, wherein
    said steps of doping said essentially n-doped region by a multiple ion implant; forming a p+-doped region on said essentially n-doped region; and heat treating the hereby obtained structure are performed to obtain a hyper-abrupt p+/n-junction with a n-type dopant concentration N on the n-side of the hyper-abrupt p+/n-junction, which substantially varies according to $$N=BW^m,$$

where B is an arbitrary constant, W is the vertical distance from the p+/n-junction, and m is −3/2 to thereby create a varactor with a capacitance that is proportional to the inverse of the square of a voltage applied to said varactor.

2. The method as claimed in claim 1 comprising the steps of:
    forming at least one dielectric layer on said essentially n-doped region;
    forming an etch mask on said at least one dielectric layer, said etch mask having an opening exposing a portion of said at least one dielectric layer located laterally within said essentially n-doped region;
    etching away said portion of said at least one dielectric layer to thereby set the lateral dimensions of said p+/n-junction; and
    removing the etch mask, all of which being performed prior to the step of forming a p+-doped region above said essentially n-doped region.

3. The method as claimed in claim 2 wherein said multiple ion implant is performed through an opening of an implantation mask and said at least one dielectric layer before the steps of forming at least one dielectric layer, forming an etch mask on said at least one dielectric layer, etching away said portion of said at least one dielectric layer, and removing the etch mask, said ion implantation opening being larger than and overlapping said etch mask opening.

4. The method as claimed in claim 2 wherein said multiple ion implant is performed through an opening an implantation mask after the steps of forming at least one dielectric layer, forming an etch mask on said at least one dielectric layer, etching away said portion of said at least one dielectric layer, and removing the etch mask, said implantation mask opening being larger than and overlapping said etch mask opening.

5. The method as claimed in claim 3 wherein said implantation mask opening is located laterally within said essentially n-doped region to avoid ion implantation at the field isolation boundary.

6. The method as claimed in claim 1 wherein said p-doped substrate includes a bulk material and at least one epitaxial layer formed thereon.

7. The method as claimed in claim 1 wherein said essentially n-doped region is formed by means of ion implantation with phosphorus.

8. The method as claimed in claim 1 wherein said essentially n-doped region is formed with a retrograde doping profile.

9. The method as claimed in claim 1 wherein said essentially n-doped region is formed with an n-type doping concentration in the order of $10^{16}$–$10^{17}$ cm$^{-3}$.

10. The method as claimed in claim 1 wherein said field isolation is formed as a shallow trench filled with oxide.

11. The method as claimed in claim 1 wherein said field isolation is formed such that it extends vertically from an upper surface of said substrate and down into the buried n$^+$-doped region.

12. The method as claimed in claim 1 wherein said field isolation is formed with respect to the buried n$^+$-doped region such that the buried n$^+$-doped region extends into areas located underneath the field isolation.

13. The method as claimed in claim 1 wherein a deep trenches is formed around, in a horizontal plane, said buried n$^+$-doped region, said deep trenches extending deeper down into the substrate than said buried n$^+$-doped regions.

14. The method as claimed in claim 1 wherein said multiple ion implant includes a first and a second implantation step, each of implantation steps using an individual dose and energy.

15. The method as claimed in claim 1 wherein said multiple ion implant includes implantation with arsenic.

16. The method as claimed in claim 1 wherein said multiple ion implant is performed to obtain an n-type doping concentration in the order of $10^{18}$–$10^{19}$ cm$^{-3}$ at the p$^+$/n-junction.

17. The method as claimed in claim 1 wherein said p$^+$-doped region is a p$^+$-doped amorphous silicon layer.

18. The method as claimed in claim 1 wherein said p$^+$-doped region is doped through ion implantation with B or BF$_2$.

19. The method as claimed in claim 1 wherein said p$^+$-doped region is formed with a p-type doping concentration in the order of $10^{19}$–$10^{21}$ cm$^{-3}$.

20. The method as claimed in claim 1 wherein said heat treatment to set the final doping profiles of the doped regions is a Rapid Thermal Anneal.

21. A method for the fabrication of a voltage controlled oscillator including an LC-oscillator having a resonance frequency being proportional to the inverse of the square root of a capacitance of the LC-oscillator, said method comprises the formation of a p$^+$/n-junction variable capacitance capacitor of said LC-oscillator, which has a voltage-controlled capacitance so that said resonance frequency is essentially linearly proportional to a voltage applied to said variable capacitance capacitor, wherein said method comprises the steps of:

providing a p-doped substrate;

forming a buried n$^+$-doped region for the variable capacitance capacitor in said substrate;

forming in said substrate an essentially n-doped region above the buried n$^+$-doped region for the variable capacitance capacitor;

forming field isolation around, in a horizontal plane, said n-doped region;

doping said essentially n-doped region by a multiple ion implant;

forming a p$^+$-doped region above said essentially n-doped region;

forming an n+-doped contact region to the buried n+-doped region; said contact region being separated from, in a lateral plane, said n-doped region by said field isolation; and heat-treating the hereby-obtained structure to set the final doping profiles of the doped regions, wherein said steps of doping said essentially n-doped region by a multiple ion implant; forming a p$^+$-doped region on said essentially n-doped region; and heat treating the hereby obtained structure are performed to obtain a hyper-abrupt p$^+$/n-junction with an n-type dopant concentration N on the n-side of the hyper-abrupt p$^+$/n-junction, which substantially varies according to $$N=BW^m,$$

where B is an arbitrary constant, W is the vertical distance from the p$^+$/n-junction, and m is −3/2 to thereby obtain said variable capacitance capacitor.

* * * * *